US011537013B2

(12) United States Patent
He

(10) Patent No.: US 11,537,013 B2
(45) Date of Patent: Dec. 27, 2022

(54) DISPLAY PANEL AND DISPLAY DEVICE

(71) Applicant: HKC CORPORATION LIMITED, Shenzhen (CN)

(72) Inventor: Huailiang He, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 109 days.

(21) Appl. No.: 17/258,452

(22) PCT Filed: Dec. 12, 2018

(86) PCT No.: PCT/CN2018/120509
§ 371 (c)(1),
(2) Date: Jan. 7, 2021

(87) PCT Pub. No.: WO2020/087671
PCT Pub. Date: May 7, 2020

(65) Prior Publication Data

US 2021/0278736 A1 Sep. 9, 2021

(30) Foreign Application Priority Data

Oct. 31, 2018 (CN) ........................ 201821778183.X

(51) Int. Cl.

| | |
|---|---|
| ***G02F 1/1345*** | (2006.01) |
| ***G02F 1/1333*** | (2006.01) |
| ***G02F 1/1362*** | (2006.01) |
| *H01L 27/12* | (2006.01) |

(52) U.S. Cl.
CPC ........ *G02F 1/13452* (2013.01); *G02F 1/1345* (2013.01); *G02F 1/133305* (2013.01); *G02F 1/136286* (2013.01); *H01L 27/124* (2013.01)

(58) Field of Classification Search
CPC ......... G02F 1/136286; G02F 1/133305; G02F 1/1345; G02F 1/13452–13458
See application file for complete search history.

(56) References Cited

U.S. PATENT DOCUMENTS

| | | | | |
|---|---|---|---|---|
| 10,049,641 | B2 * | 8/2018 | Wang | G09G 5/006 |
| 2016/0027355 | A1 | 1/2016 | Tsuchi | |
| 2017/0278469 | A1 * | 9/2017 | Iwami | G09G 3/3648 |

FOREIGN PATENT DOCUMENTS

| | | | |
|---|---|---|---|
| CN | 1841480 | A | 10/2006 |
| CN | 102495486 | A | 6/2012 |
| CN | 103956132 | A | 7/2014 |
| CN | 104008714 | A | 8/2014 |
| CN | 106571116 | A | 4/2017 |

OTHER PUBLICATIONS

Weiwei Yang, the ISA written comments, Jul. 2019, CN.
Weiwei Yang, the International Search Report, dated Jul. 2019, CN.

* cited by examiner

*Primary Examiner* — Dung T Nguyen

(57) ABSTRACT

This application discloses a display panel and a display device. The display panel includes a substrate, source driving chips, and gate chips. The source driving chip includes two sets of pins. The two sets of pins are respectively located on a first side and a second side of a same source driving chip. The gate chips are connected to different sets of pins.

11 Claims, 5 Drawing Sheets

700 500 311 312 334 333 335 314 331 330 332 313

DISPLAY PANEL AND DISPLAY DEVICE

CROSS REFERENCE OF RELATED APPLICATION

This application claims priority to the Chinese Patent Application No. CN201821778183.X, filed with National Intellectual Property Administration. PRC on Oct. 31, 2018 and entitled "DISPLAY PANEL AND DISPLAY DEVICE", which is incorporated herein by reference in its entirety.

TECHNICAL FIELD

This application relates to the field of display technologies, and in particular, to a display panel and a display device.

BACKGROUND

Statements herein only provide background information related to this application, and do not necessarily constitute related art.

With the development and progress of science and technology, a liquid crystal display becomes a mainstream product of displays due to a thin body, power saving, and low radiation, etc. and is widely used. Most of the liquid crystal displays in the market are backlight liquid crystal displays and include a liquid crystal panel and a backlight module. A working principle of the liquid crystal panel is to place liquid crystal molecules between two parallel glass substrates, and apply a driving voltage on the two glass substrates to control a rotation direction of the liquid crystal molecules, to refract light from the backlight module to produce images.

A thin film transistor-liquid crystal display (TFT-LCD) gradually takes the leading position in the display field due to its low power consumption, excellent picture quality, and high production yield, etc. Similarly, the thin film transistor-liquid crystal display includes a liquid crystal panel and a backlight module. The liquid crystal panel includes a color film substrate (CF Substrate, also called a color filter substrate), a thin film transistor substrate (TFT Substrate) and a mask, and there are transparent electrodes on relative inner sides of the substrates. A layer of liquid crystal molecules (LC) is sandwiched between the two substrates. The display causes poor bonding of a flexible printed circuit board, affecting a use effect of the display and view experience of people.

SUMMARY

This application is intended to provide a display panel and a display device, to resolve a problem that poor bonding of a flexible printed circuit board of a display affects a use effect of the display and view experience of people.

In order to achieve the foregoing objective, this application provides a display panel including a substrate, a flexible printed circuit board, source driving chips, and gate chips. The substrate includes a active area and a non-active area. The non-active area is provided with signal lines. The flexible printed circuit board is connected to a first edge of the substrate. The source driving chip is arranged on the flexible printed circuit board. The source driving chip includes two sets of pins. The two sets of pins are respectively located on a first side and a second side of a same source driving chip. The gate chips are respectively arranged on a second edge and a third edge of the substrate. The second edge and the third edge are respectively located on a first side and a second side of the first edge. The gate chips are respectively connected to different sets of pins through the signal lines.

Optionally, each of the signal lines is symmetrically connected to the two sets of pins on the first side and the second side of the same source driving chip.

Optionally, there are at least two source driving chips, and each of the signal lines is connected to the pins of at least two source driving chips in a scattered manner.

Optionally, the non-active area includes a metal layer. The metal layer including a first metal layer and a second metal layer. There the first metal layer includes data lines, a first through hole, and a second through hole. Each of the signal lines including a second signal line segment, a third signal line segment, and a fourth signal line segment. The second signal line segment is arranged on the first metal layer. The third signal line segment is arranged on the second metal layer. The fourth signal line segment is arranged on the first metal layer. The second signal line segment is connected to the third signal line segment through the first through hole. The third signal line segment is connected to the fourth signal line segment through the second through hole. The first through hole and the second through hole are arranged on the first metal layer and located on a first side and a second side of a position corresponding to the data lines. The other end of the fourth signal line segment is connected to the gate chip.

Optionally, the non-active area includes a metal layer. The metal layer including a first metal layer and an insulating layer. The insulating layer is arranged on a surface of the first metal layer. The first metal layer includes data lines arranged on the surface of the first metal layer. The insulating layer covers the data lines. The signal lines are laid above the insulating layer and then connected to the gate chip.

Optionally, the non-active area includes a metal layer. The metal layer includes a first metal layer and a second metal layer. The first metal layer includes a first through hole and is provided with data lines. Each of the signal lines includes a second signal line segment and a third signal line segment. One end of the second signal line segment is connected to a pin. The third signal line segment is arranged on the second metal layer. The other end of the second signal line segment is connected to one end of the third signal segment line segment through the first through hole. The other end of the third signal line segment is connected to the gate chip.

Optionally, the signal lines are respectively connected to the source driving chips at both ends of the first edge.

Optionally, the display panel includes two circuit boards. Each of the circuit boards is connected to the two flexible printed circuit boards. The non-active area includes a metal layer. The metal layer including a first metal layer and a second metal layer. The other end of the source driving chip is connected to the circuit board through the flexible printed circuit board. Each of the signal lines includes a first signal line segment, a second signal line segment, a third signal line segment, and a fourth signal line segment. The first signal line segment is arranged on the flexible printed circuit board. Two ends of the first signal line segment are respectively connected to the circuit board and the source driving chip. Two ends of the second signal line segment are respectively connected to the pin and the first metal layer. The third signal line segment is arranged on the second metal layer. One end of the third signal line segment is connected to the second signal line segment. The fourth signal line segment is arranged on the first metal layer. One end of the fourth signal line segment is connected to the other end of the third signal line segment, and the other end of the fourth signal line segment is connected to the gate chip.

This application further discloses a display panel including a substrate, a flexible printed circuit board, source driving chips, and gate chips. The substrate including a active area and a non-active area. The non-active area is provided with signal lines. The flexible printed circuit board is connected to the substrate. The source driving chip is arranged on the flexible printed circuit board and connected to the substrate through the flexible printed circuit board. The source driving chip includes two sets of pins. The two sets of pins are respectively located on a first side and a second side of a same source driving chip. The gate chips are arranged on the edge of the substrate, located at positions on a first side and a second side of the source driving chip, and connected to the substrate. The gate chips are respectively connected to different sets of pins through the signal lines.

Each of the signal lines is symmetrically connected to the two sets of pins on the first side and the second side of the same source driving chip.

The non-active area includes a metal layer. The metal layer including a first metal layer and a second metal layer. The first metal layer includes data lines, a first through hole, and a second through hole. Each of the signal lines including a second signal line segment, a third signal line segment, and a fourth signal line segment. The second signal line segment is arranged on the first metal layer. The third signal line segment is arranged on the second metal layer. The fourth signal line segment is arranged on the first metal layer. The second signal line segment is connected to the third signal line segment through the first through hole. The third signal line segment is connected to the fourth signal line segment through the second through hole. The first through hole and the second through hole are arranged on the first metal layer and located on a first side and a second side of a position corresponding to the data lines. The other end of the fourth signal line segment is connected to the gate chip.

The display panel includes a first edge, and the source driving chip is connected to the first edge. Each of the signal lines is connected to the source driving chips at both ends of the first edge.

This application further discloses a display device. The display device includes the foregoing display panel.

Pins of the source driving chip are arranged on a first side and a second side. In this application, the signal lines are respectively connected to different sets of pins to make full use of surplus pins of the source driving chip, so that a number of pins of the source driving chip may be further reduced. In a case that a size of the flexible printed circuit board remains unchanged, a spacing between the pins may be appropriately increased, or the pins may be made wider, thereby increasing a bonding area and improving a bonding yield.

BRIEF DESCRIPTION OF DRAWINGS

The included accompanying drawings are used for providing further understanding of the embodiments of this application, constitute a part of the specification, and are configured to illustrate implementations of this application and explain the principle of this application together with literal descriptions. Apparently, the accompanying drawings described below are only some embodiments of this application, and a person of ordinary skill in the art may further obtain other drawings according to these accompanying drawings without creative efforts. In the drawings.

DETAILED DESCRIPTION OF EMBODIMENTS

Figure 1:
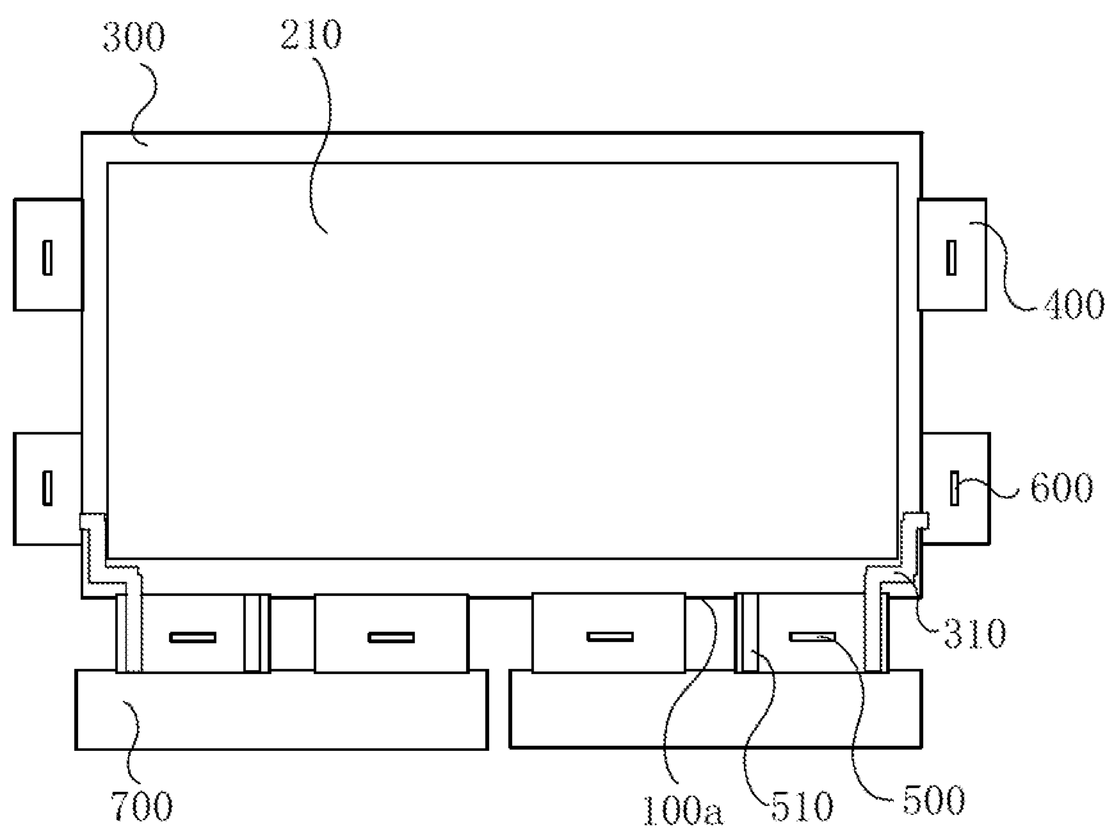
FIG. 1 is a schematic diagram of a display panel structure according to one embodiment of this application.

Specific structures and functional details disclosed herein are merely representative, and are intended to describe the objectives of the exemplary embodiments of this application. However, this application may be specifically implemented in many alternative forms, and should not be construed as being limited to the embodiments described herein.

In the description of this application, it should be understood that orientation or position relationships indicated by the terms such as "center", "transverse", "above", "below", "left", "right", "vertical", "horizontal", "top", "bottom", "inside", and "outside" are based on orientation or position relationships shown in the accompanying drawings, and are used only for ease and brevity of illustration and description of this application, rather than indicating or implying that the mentioned apparatus or component necessarily have a particular orientation or be necessarily constructed and operated in a particular orientation. Therefore, such terms should not be construed as limiting of this application. In addition, the terms such as "first" and "second" are used only for the purpose of description, and should not be understood as indicating or implying the relative importance or implicitly specifying the quantity of the indicated technical features. In view of this, a feature defined to be "first" or "second" may explicitly or implicitly include one or more features. In the description of this application, unless otherwise stated, "a plurality of" means two or more than two. In addition, the term "include", and any variant thereof are intended to cover non-exclusive inclusion.

In the description of this application, it should be noted that unless otherwise explicitly specified or defined, the terms such as "mount", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. A person of ordinary skill in the art may understand the specific meanings of the foregoing terms in this application according to specific situations.

The terms used herein is for the purpose of describing specific embodiments only and is not intended to limit exemplary embodiments. As used herein, the singular forms "a" and "an" are intended to include the plural forms as well, unless the context clearly indicates otherwise. It should be further understood that the terms "include" and/or "comprise" when used in this specification, specify the presence of stated features, integers, steps, operations, units, and/or components, but do not preclude the presence or addition of one or more other features, integers, steps, operations, units, components, and/or combinations thereof.

A voltage and a signal required by a gate of a display panel are transmitted to a circuit of the gate through a pin (bypass pin) of a source flexible printed circuit board (source COF) and a wire on array (WOA). The signal and voltage required by the gate usually need more than 20 wires, and are usually transmitted from an edge of the source flexible printed circuit board (source COF) on an edge of the panel and then transmitted to the gate through the wire on array (WOA).

This application is further described below with reference to the drawings and embodiments.

Figure 2:
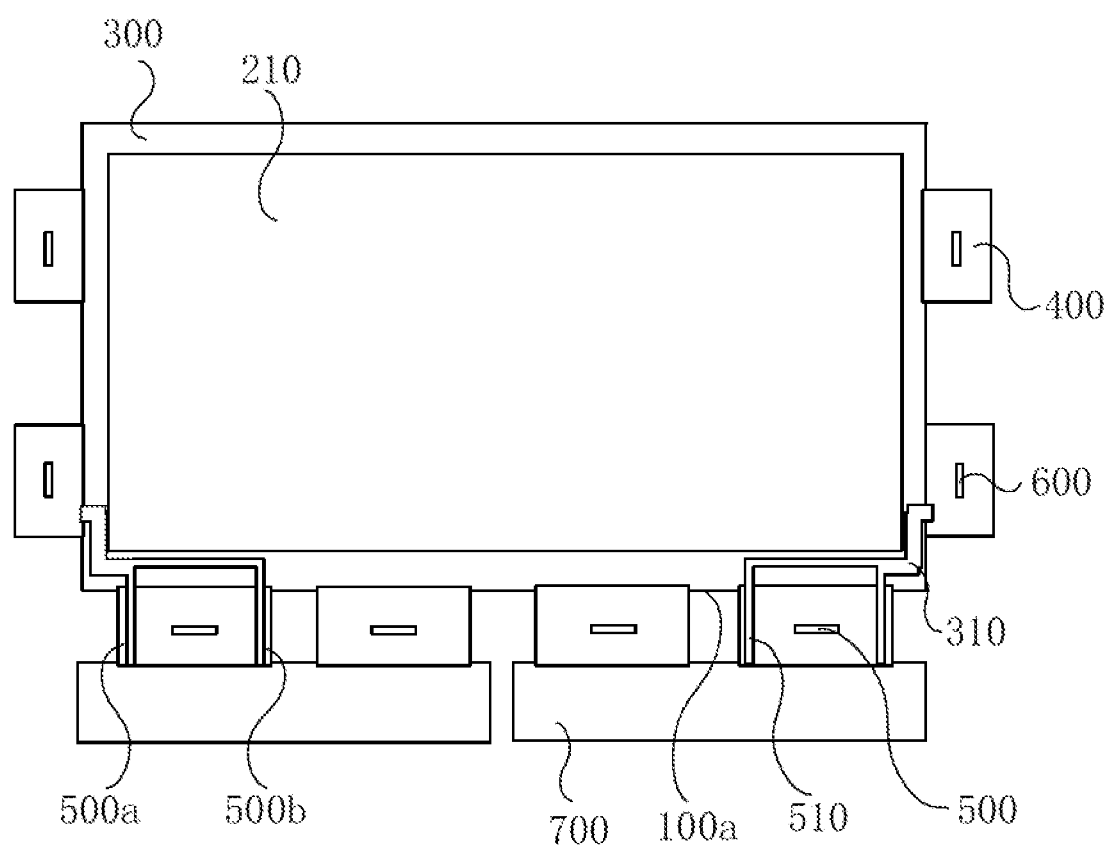
FIG. 2 is a schematic diagram of a display panel structure according to another embodiment of this application.
Figure 3:
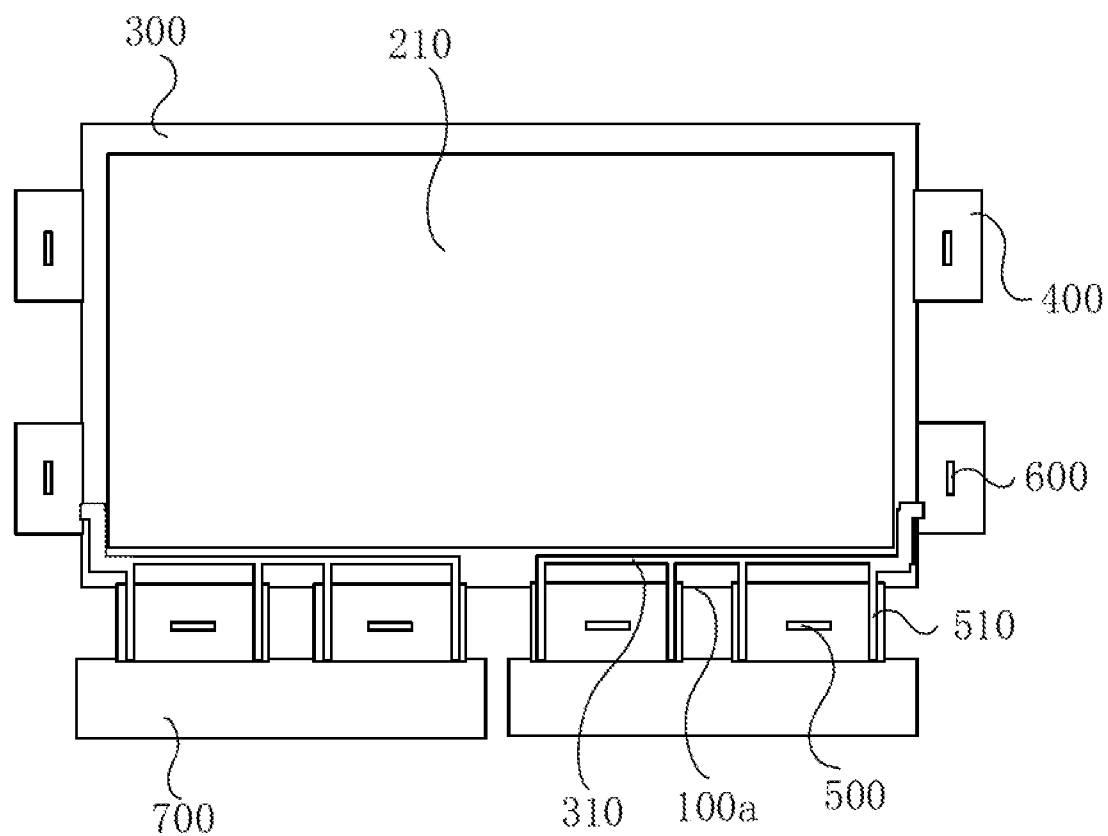
FIG. 3 is a schematic diagram of a display panel structure according to one embodiment of this application.
Figure 4:
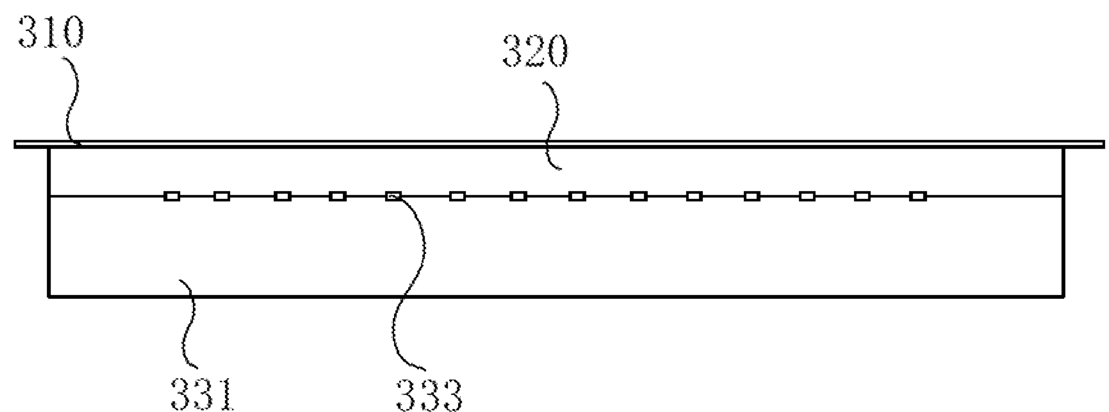
FIG. 4 is a schematic diagram of a cross-sectional structure of laying of a data line and a signal line according to one embodiment of this application.
Figure 5:
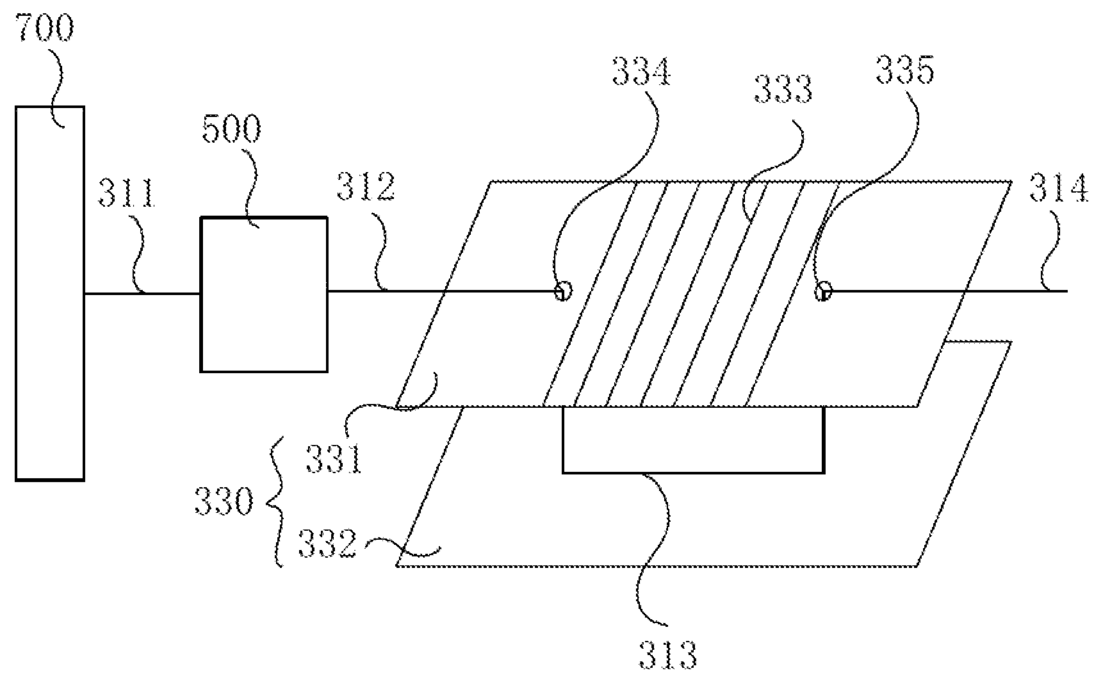
FIG. 5 is a schematic diagram of a wiring path of a signal line according to one embodiment of this application.
Figure 6:
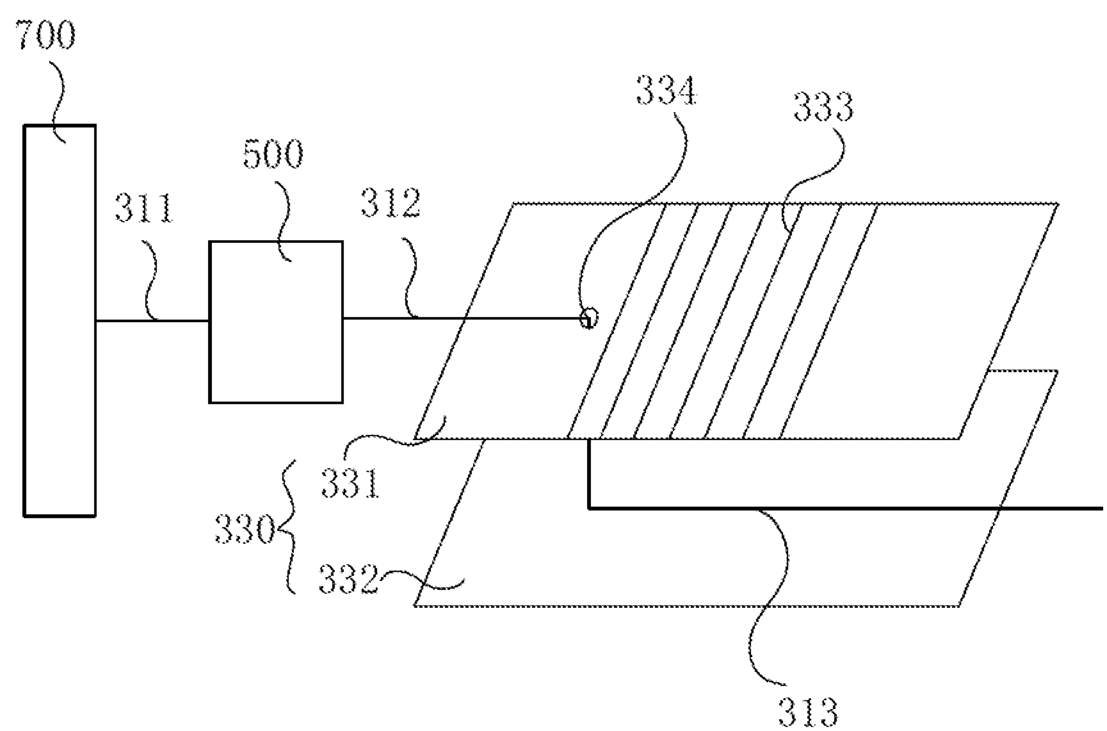
FIG. 6 is a schematic diagram of a wiring path of a signal line according to another embodiment of this application.

As shown in FIG. 2 to FIG. 6, embodiments of this application disclose a display panel 100. The display panel includes a substrate 200, a flexible printed circuit board 400, source driving chips 500, and gate chips 600. The substrate 200 includes a active area 210 and a non-active area 300. The non-active area 300 is arranged around an edge of the active area 210. The non-active area 300 is provided with signal lines 310. The flexible printed circuit board 400 is arranged on a first edge 100*a* of the substrate 200. The source driving chip 500 is arranged on the flexible printed circuit board 400. The source driving chip 500 includes two sets of pins 510. The two sets of pins 510 are respectively located on a first side 500*a* and a second side 500*b* of a same source driving chip 500. The gate chip 600 is arranged on a second edge 100*b* and a third edge 100*c* of the substrate 200. The second edge 100*b* and the third edge 100*c* are respectively located on a first side and a second side of the first edge 100*a*. The gate chips 600 are respectively connected to different sets of pins 510 through the signal lines 310.

In this solution, the pins 510 of the source driving chip 500 are arranged on the first side and the second side. In this application, the signal lines 310 are respectively connected to different sets of pins 510 to make full use of surplus pins 510 of the source driving chip 500, so that a number of pins of the source driving chip 500 may be further reduced. In a case that a size of the flexible printed circuit board 400 remains unchanged, a spacing between the pins may be appropriately increased, or the pins may be made wider, thereby increasing a bonding area and improving a bonding yield.

In one or more embodiments, one end of the signal line 310 is connected to one gate chip 600, and the other end of the signal line 310 is symmetrically connected to the pins 510 on the first side and the second side of a same source driving chip 500.

In this solution, through symmetrical connection to the pins 510 on the first side and the second side of the same source driving chip 500, all pins 510 are rationally utilized without adding a number of required source driving chips 500, so that a number of pins 510 required for the source driving chip 500 is reduced.

In one or more embodiments, there are at least two source driving chips 500, and each of the signal lines 310 is connected to the pins 510 of at least two source driving chips 500 in a scattered manner.

In this solution, each of the signal lines 310 is scattered to one source driving chip 500, so that a number of the pins is reduced by half at most. If the signal line is scattered to two source driving chips, the number of the pins is theoretically reduced to a quarter, and so on, so that the number of the required pins 510 on one source driving chip 500 is reduced even more.

In one or more embodiments, the non-active area 300 includes a first metal layer 331 and a second metal layer 332. The first metal layer 331 includes data lines 333. The first metal layer 331 includes a first through hole 334 and a second through hole 335. Each of the signal lines 310 includes a second signal line segment 312, a third signal line segment 313, and a fourth signal line segment 314. The second signal line segment 312 is arranged on the first metal layer 331, the third signal line segment 313 is arranged on the second metal layer 332, and the fourth signal line segment 314 is arranged on the first metal layer 331. The second signal line segment 312 is connected to the third signal line segment 313 through the first through hole 334. The third signal line segment 313 is connected to the fourth signal line segment 314 through the second through hole 335. The first through hole 334 and the second through hole 335 are arranged on the first metal layer 331 and are located on a first side and a second side of a position corresponding to the data lines 333. The other end of the fourth signal line segment 314 is connected to the gate chip 600.

In this solution, when the signal lines 310 are almost connected to a position of the data lines 333, the signal lines make a detour on the second metal layer 332 and then go back to the first metal layer 331, without increasing other structures, avoiding intersection with the data lines 333 and preventing the signal lines 310 from interfering with the data lines 333.

In one or more embodiments, the non-active area 300 includes the first metal layer 331 and the insulating layer 320. The insulating layer 320 is arranged on a surface of the first metal layer 331. The first metal layer 331 includes the data lines 333. The data lines 333 is arranged on the surface of the first metal layer 331. The insulating layer 320 covers the data lines 333. The signal lines 310 are laid from above the insulating layer 320 and then connected to the gate chip 600.

In this solution, one insulating layer 320 covers the data lines 333 and the signal lines 310 are laid from above the insulating layer 320, so that the data lines 333 may be separated from the signal lines 310 without improving other existing structures, preventing the signal lines 310 from interfering with the data lines 333.

In one or more embodiments, the non-active area 300 includes the first metal layer 331 and the second metal layer 332. The first metal layer 331 includes the first through hole 334, and the first metal layer 331 is provided with the data lines 333. Each of the signal lines 310 includes the second signal line segment 312 and the third signal line segment 313. One end of the second signal line segment 312 is connected to a pin 510. The third signal line segment 313 is arranged on the second metal layer 332. The other end of the second signal line segment 312 is connected to one end of the third signal line segment 313 through the first through hole 334. The other end of the third signal line segment 313 is connected to the gate chip 600.

In this solution, the signal lines 310 are laid through the source driving chip 500, and then the signal lines 310 are guided, for wiring, to the second metal layer 332 through the first through hole 334 on the first metal layer 331, and then wired to the gate chip 600. The data lines 333 and the signal lines 310 are directly arranged on the first metal layer 331 and the second metal layer 332, respectively, so that no cross occurs between the data lines 333 and the signal lines 310, preventing mutual interference.

In one or more embodiments, each of the signal lines 310 is connected to the source driving chip 500 at both ends of the first side 100*a*.

In this solution, the signal lines 310 are laid by using redundant pins outside the source driving chip 500, to shorten a length of the signal lines 310 to be laid and reduce a difficulty in laying.

In one or more embodiments, the display panel 100 includes two circuit boards 700. Each of the circuit boards 700 is connected to two flexible printed circuit boards 400. The non-active area 300 includes a metal layer 330. The metal layer 330 includes the first metal layer 331 and the second metal layer 332. The other end of the source driving chip 500 is connected to the circuit board 700 through the flexible printed circuit board 400. Each of the signal lines 310 includes a first signal line segment 311, the second signal line segment 312, the third signal line segment 313, and the fourth signal line segment 314. The first signal line segment 311 is arranged on the flexible printed circuit board 400. Two ends of the first signal line segment are respectively connected to the circuit board 700 and the source driving chip 500. Two ends of the second signal line segment 312 are respectively connected to the pin 510 and the first metal layer 331. The third signal line segment 313 is arranged the second metal layer 332. One end of the third signal line segment 313 is connected to the second signal line segment 312. The fourth signal line segment 314 is arranged on the first metal layer 331. One end of the fourth signal line segment 314 is connected to the other end of the third signal line segment 313, and the other end of the fourth signal line segment 314 is connected to the gate chip 600.

The circuit board 700 is a control circuit board.

In this solution, the signal lines 310 are laid through an existing structure in the display panel 100, and no additional structure is needed, to save material costs and a space.

As another embodiment of this application, as shown in FIG. 2 to FIG. 6, a display panel 100 is disclosed. The display panel includes a substrate 200, a flexible printed circuit board 400, source driving chips 500, and a gate chip 600. The substrate 200 includes a active area 210 and a non-active area 300. The non-active area 300 is arranged around an edge of the active area 210. The non-active area 300 is provided with the signal lines 310. The flexible printed circuit board 400 is arranged on an edge of the substrate 200 and connected to the substrate 200. The source driving chip 500 is arranged on the flexible printed circuit board 400 and connected to the substrate 200 through the flexible printed circuit board 400. The source driving chip 500 includes two sets of pins 510. The two sets of pins 510 are respectively located on a first side 500*a* and a second side 500*b* of a same source driving chip 500. The gate chips 600 are arranged on edges of the substrate 200, located at positions on a first side and a second side of an edge where the source driving chip 500 is located, and are connected to the substrate 200. The gate chips 600 are respectively connected to different sets of pins 510 through the signal lines 310.

one end of the signal line 310 is connected to one gate chip 600, and the other end of the signal line 310 is symmetrically connected to the pins 510 on the first side and the second side of a same source driving chip 500.

The non-active area 300 includes a first metal layer 331 and a second metal layer 332. The first metal layer 331 includes data lines 333. The first metal layer 331 includes a first through hole 334 and a second through hole 335. Each of the signal lines 310 includes a second signal line segment 312, a third signal line segment 313, and a fourth signal line segment 314. The second signal line segment 312 is arranged on the first metal layer 331, the third signal line segment 313 is arranged on the second metal layer 332, and the fourth signal line segment 314 is arranged on the first metal layer 331. The second signal line segment 312 is connected to the third signal line segment 313 through the first through hole 334. The third signal line segment 313 is connected to the fourth signal line segment 314 through the second through hole 335. The first through hole 334 and the second through hole 335 are arranged on the first metal layer 331 and are located on a first side and a second side of a position corresponding to the data lines 333. The other end of the fourth signal line segment 314 is connected to the gate chip 600.

The display panel 100 includes a first edge 100*a*. The source driving chip 500 is connected to the first edge 100*a*. Each of the signal lines 310 is connected to the source driving chip 500 at both ends of the first edge 100*a*.

In this solution, the pins 510 of the source driving chip 500 are arranged on the first side and the second side. In this application, the signal lines 310 are respectively connected to different sets of pins 510 to make full use of surplus pins 510 of the source driving chip 500, so that a number of pins of the source driving chip 500 may be further reduced. In a case that a size of the flexible printed circuit board 400 remains unchanged, a spacing between the pins may be appropriately increased, or the pins may be made wider, thereby increasing a bonding area and improving a bonding yield. Through symmetrical connection to the pins 510 on the first side and the second side of the same source driving chip 500, all pins 510 are rationally utilized, without adding a number of required source driving chips 500, so that a number of pins 510 required for the source driving chip 500 is reduced. When the signal lines 310 are almost connected to a position of the data lines 333, the signal lines make a detour on the second metal layer 332 and then go back to the first metal layer 331, without increasing other structures, avoiding intersection with the data lines 333 and preventing the signal lines 310 from interfering with the data lines 333. The signal lines 310 are laid by using the source driving chip 500 outside, to shorten a length of the signal lines 310 to be laid and reduce a difficulty in laying.

Figure 7:
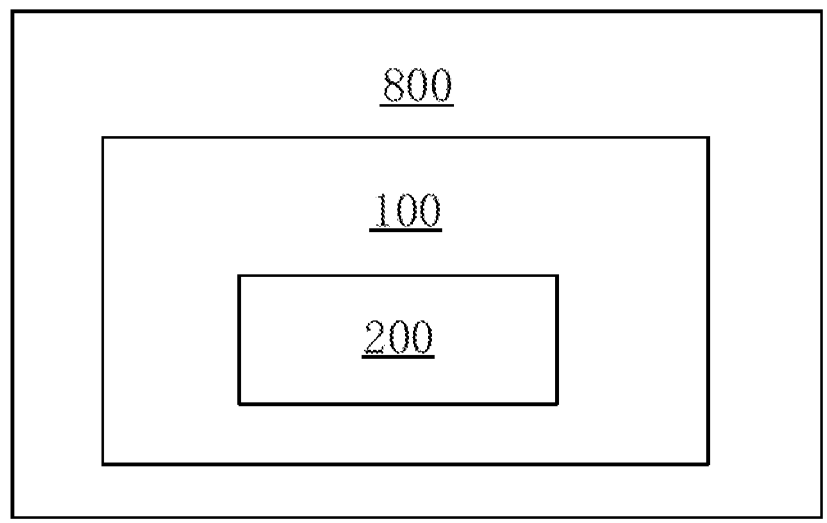
FIG. 7 is a schematic diagram of a display device structure according to one embodiment of this application.

As another embodiment of this application, as shown in FIG. 2 to FIG. 7, a display device 800 is disclosed. The display device 800 includes the foregoing display panel 100.

The panel of this application may be a twisted nematic (TN) panel, an in-plane switching (IPS) panel, or a multi-domain vertical alignment (VA) panel, and certainly may be any other suitable type of panel.

The foregoing contents are detailed descriptions of this application in conjunction with specific embodiments, and it should not be considered that the specific implementation of this application is limited to these descriptions. A person of ordinary skill in the art can further make simple deductions or replacements without departing from the concept of this application, and such deductions or replacements should all be considered as falling within the protection scope of this application.

What is claimed is:

1. A display panel, comprising:

a substrate;

a active area arranged on the substrate;

a non-active area arranged around an edge of the active area and provided with signal lines;

a flexible printed circuit board arranged on a first edge of the substrate;

source driving chips arranged on the flexible printed circuit board and comprising two sets of pins respectively located on a first side and a second side of a same source driving chip; and gate chips respectively arranged on a second edge and a third edge of the substrate, the second edge and the third edge being respectively located on a first side and a second side of the first edge; and the gate chips being respectively connected to different sets of pins through the signal lines;

wherein the non-active area comprises a metal layer, the metal layer comprising a first metal layer and a second metal layer, wherein the first metal layer comprises data lines, a first through hole, and a second through hole, and each of the signal lines comprising a second signal line segment, a third signal line segment, and a fourth signal line segment, wherein the second signal line segment is arranged on the first metal layer, the third signal line segment is arranged on the second metal layer, the fourth signal line segment is arranged on the first metal layer, the second signal line segment is connected to the third signal line segment through the first through hole, and the third signal line segment is connected to the fourth signal line segment through the second through hole, the first through hole and the second through hole being arranged, on the first metal layer, on a first side and a second side of a position corresponding to the data lines, and the other end of the fourth signal line segment being connected to the gate chip.

2. The display panel according to claim 1, wherein one end of the signal line is connected to the gate chip, and the other end of the signal line is symmetrically connected to the two sets of pins on the first side and the second side of the same source driving chip.

3. The display panel according to claim 2, wherein the signal lines are respectively connected to the source driving chips at both ends of the first edge.

4. The display panel according to claim 1, wherein there are at least two source driving chips, and each of the signal lines is respectively connected to the pins of the at least two source driving chips.

5. The display panel according to claim 1, wherein the display panel comprises two circuit boards, each of the two circuit boards being connected to the two flexible printed circuit boards, the other end of the source driving chip is connected to the circuit board through the flexible printed circuit board, and each of the signal lines comprises a first signal line segment, the second signal line segment, the third signal line segment, and the fourth signal line segment, wherein the first signal line segment is arranged on the flexible printed circuit board, two ends of the first signal line segment being respectively connected to the circuit board and the source driving chip, and two ends of the second signal line segment being respectively connected to the pin and the first metal layer; wherein one end of the third signal line segment is connected to the second signal line segment; and wherein one end of the fourth signal line segment is connected to the other end of the third signal line segment.

6. A display panel, comprising:

a substrate comprising an active area and a non-active area, the non-active area being arranged around an edge of the active area; and wherein the non-active area is provided with signal lines;

a flexible printed circuit board arranged on an edge of the substrate and connected to the substrate;

source driving chips arranged on the flexible printed circuit board and connected to the substrate through the flexible printed circuit board, the source driving chip comprising two sets of pins respectively located on a first side and a second side of a same source driving chip; and gate chips arranged on edges of the substrate, located at positions on a first side and a second side of the source driving chip, and connected to the substrate, wherein the gate chips are respectively connected to different sets of pins through the signal lines;

each of the signal lines is symmetrically connected to the two sets of pins on the first side and the second side of the same source driving chip;

the non-active area comprises a metal layer, the metal layer comprising a first metal layer and a second metal layer, wherein the first metal layer comprises data lines, a first through hole, and a second through hole, each of the signal lines comprising a second signal line segment, a third signal line segment, and a fourth signal line segment, wherein the second signal line segment is arranged on the first metal layer, the third signal line segment is arranged on the second metal layer, the fourth signal line segment is arranged on the first metal layer, the second signal line segment is connected to the third signal line segment through the first through hole, and the third signal line segment is connected to the fourth signal line segment through the second through hole, the first through hole and the second through hole being arranged on the first metal layer and located on a first side and a second side of a position corresponding to the data lines, and the other end of the fourth signal line segment being connected to the gate chip; and the display panel comprises a first edge, the source driving chips being connected to the first edge, the signal lines being connected to the source driving chips at both ends of the first edge.

7. A display device, comprising:

a substrate;

a active area arranged on the substrate;

a non-active area arranged around an edge of the active area and provided with signal lines;

a flexible printed circuit board arranged on a first edge of the substrate;

source driving chips arranged on the flexible printed circuit board and comprising two sets of pins respectively located on a first side and a second side of a same source driving chip; and gate chips respectively arranged on a second edge and a third edge of the substrate, the second edge and the third edge being respectively located on a first side and a second side of the first edge; and the gate chips being respectively connected to different sets of pins through the signal lines;

wherein the non-active area comprises a metal layer, the metal layer comprising a first metal layer and a second metal layer, wherein the first metal layer comprises data lines, a first through hole, and a second through hole, each of the signal lines comprising a second signal line segment, a third signal line segment, and a fourth signal line segment, wherein the second signal line segment is arranged on the first metal layer, the third signal line segment is arranged on the second metal layer, the fourth signal line segment is arranged on the first metal layer, the second signal line segment is connected to the third signal line segment through the first through hole, and the third signal line segment is connected to the fourth signal line segment through the second through hole, the first through hole and the second through hole being arranged, on the first metal layer, on a first side and a second side of a position corresponding to the data lines, and the other end of the fourth signal line segment being connected to the gate chip.

8. The display device according to claim 7, wherein one end of the signal line is connected to the gate chip and the other end of the signal line is symmetrically connected to the two sets of pins on the first side and the second side of the same source driving chip.

9. The display device according to claim 7, wherein there are at least two source driving chips, and each of the signal lines is respectively connected to pins of the at least two source driving chips.

10. The display device according to claim 8, wherein the signal line is connected to the source driving chips at both ends of the first edge.

11. The display device according to claim 7, wherein the display panel comprises two circuit boards, each of the two circuit boards being connected to the two flexible printed circuit boards, the other end of the source driving chip is connected to the circuit board through the flexible printed circuit board, and the signal line comprises a first signal line segment, the second signal line segment, the third signal line segment, and the fourth signal line segment, wherein the first signal line segment is arranged on the flexible printed circuit board, two ends of the first signal line segment being respectively connected to the circuit board and the source driving chip, and two ends of the second signal line segment being respectively connected to the pin and the first metal layer; wherein one end of the third signal line segment is connected to the second signal line segment; and wherein one end of the fourth signal line segment is connected to the other end of the third signal line segment.

* * * * *